United States Patent
Schuster

(10) Patent No.: US 7,446,951 B2
(45) Date of Patent: Nov. 4, 2008

(54) IMAGING SYSTEM, IN PARTICULAR A PROJECTION OBJECTIVE OF A MICROLITHOGRAPHIC PROJECTION EXPOSURE APPARATUS

(75) Inventor: Karl-Heinz Schuster, Koenigsbronn (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 12/046,809

(22) Filed: Mar. 12, 2008

(65) Prior Publication Data

US 2008/0151381 A1    Jun. 26, 2008

Related U.S. Application Data

(63) Continuation of application No. 11/492,725, filed on Jul. 25, 2006, now Pat. No. 7,362,514.

(60) Provisional application No. 60/706,883, filed on Aug. 10, 2005.

(51) Int. Cl.
*G02B 3/02* (2006.01)

(52) U.S. Cl. .............. 359/720; 359/712; 359/718; 359/719; 359/796

(58) Field of Classification Search ............ 359/708, 359/712, 718–720, 796
See application file for complete search history.

(56) References Cited

U.S. PATENT DOCUMENTS

| | | | | |
|---|---|---|---|---|
| 6,788,389 | B2 * | 9/2004 | Fujishima et al. | 355/67 |
| 7,075,720 | B2 | 7/2006 | McGuire, Jr. | |
| 7,277,231 | B2 * | 10/2007 | Schuster et al. | 359/665 |
| 7,362,514 | B2 * | 4/2008 | Schuster | 359/720 |
| 2003/0011896 | A1 | 1/2003 | Shiraishi | |
| 2003/0027349 | A1 | 2/2003 | Ookubo | |
| 2003/0099047 | A1 | 5/2003 | Hoffmann et al. | |
| 2004/0105170 | A1 | 6/2004 | Krahmer et al. | |
| 2004/0145806 | A1 | 7/2004 | Hoffman et al. | |

(Continued)

FOREIGN PATENT DOCUMENTS

EP    1 646 074 A1    4/2006

(Continued)

OTHER PUBLICATIONS

Shiraishi et al., "Progress of Nikon's F2 Exposure Tool Development," Proceedings of the SPIE, SPIE, Bellingham, VA, US, vol. 4691, 2002, pp. 594-601.

(Continued)

*Primary Examiner*—Evelyn A. Lester
(74) *Attorney, Agent, or Firm*—Fish & Richardson P.C.

(57) ABSTRACT

Imaging systems, in particular a projection objectives of a microlithographic projection exposure apparatus, are provided. The imaging systems can have an optical axis and produce an image field which is extra-axial relative to the optical axis. The imaging systems can include a first optical element which causes a first distribution of the retardation in a plane that lies perpendicular to the optical axis, and at least one second optical element which causes a second distribution of the retardation in a plane that lies perpendicular to the optical axis. The second distribution of the retardation can at least partially compensate the first distribution of the retardation. The first and the second optical elements can be designed without rotational symmetry relative to the optical axis.

20 Claims, 4 Drawing Sheets

U.S. PATENT DOCUMENTS

| | | |
|---|---|---|
| 2005/0030506 A1 | 2/2005 | Schuster |
| 2005/0117224 A1 | 6/2005 | Shafer et al. |
| 2005/0200966 A1 | 9/2005 | Totzeck et al. |
| 2006/0050400 A1 | 3/2006 | Hoffman et al. |
| 2006/0109560 A1 | 5/2006 | Kamenov et al. |
| 2006/0209278 A1 | 9/2006 | Kiuchi et al. |
| 2006/0238895 A1 | 10/2006 | Clauss |
| 2007/0035848 A1 | 2/2007 | Schuster |

FOREIGN PATENT DOCUMENTS

| | | |
|---|---|---|
| WO | WO 02/093209 A2 | 11/2002 |
| WO | WO 02/099500 A2 | 12/2002 |
| WO | WO 2004/023172 | 3/2004 |
| WO | WO 2005/006417 | 1/2005 |
| WO | WO 2005/059617 | 6/2005 |
| WO | WO 2005/059617 A2 | 6/2005 |
| WO | WO 2005/059654 | 6/2005 |
| WO | WO 2005/081067 | 9/2005 |
| WO | WO 2006/066816 | 6/2006 |
| WO | WO 2006/089919 A1 | 8/2006 |

OTHER PUBLICATIONS

Scholze, "Glass: Nature, Structure, and Properties," Springer-Verlag Berlin Heidelberg Germany, 1988, pp. 121-140.

* cited by examiner

IMAGING SYSTEM, IN PARTICULAR A PROJECTION OBJECTIVE OF A MICROLITHOGRAPHIC PROJECTION EXPOSURE APPARATUS

CROSS-REFERENCE TO RELATED APPLICATION

This application is a continuation application of and claims priority to U.S. application Ser. No. 11/492,725, filed on Jul. 25, 2006, which claims the benefit under 35 U.S.C. §119(e)(1) of U.S. Provisional Patent Application Ser. No. 60/706,883, filed Aug. 10, 2005, the contents of which are hereby incorporated by reference.

FIELD OF THE INVENTION

The invention relates to an imaging system, in particular a projection objective of a projection exposure apparatus used in the field of microlithography. The invention relates in particular to a projection objective which even with an off-axis image field allows the use of highly refractive crystal materials while keeping the negative effect of birefringence on image quality within limits.

BACKGROUND

In current state-of-the-art microlithography objectives, particularly in immersion objectives with a numerical aperture value (NA) of more than 1.0, there is a growing need to use materials of a high refractive index. In this context, a refractive index is considered high if, at the given wavelength, it exceeds the value for the refractive index of quartz, which has a refractive index of about 1.56 at a wavelength of 193 nm. A number of materials are known whose refractive indices at DUV- and VUV wavelengths (<250 nm) are larger than 1.6, for example magnesium spinel with a refractive index of about 1.87 at a wavelength of 193 nm, or magnesium oxide which has a refractive index of about 2.0 at 193 nm.

When using these materials as lens elements, the problem presents itself that due to their cubic crystallographic structure, they exhibit a degree of intrinsic birefringence that increases as the wavelength becomes shorter. For example, measurements of the retardation due to intrinsic birefringence in magnesium spinel at a wavelength of 193 nm produced a value of 52 nm/cm, while the retardation due to intrinsic birefringence in magnesium oxide at a wavelength of 193 nm was estimated to be about 72 nm/cm. Depending on the design-related conditions in the image field, a retardation of this magnitude can lead to lateral ray deflections that are three to five times as large as today's critical structure widths of about 80-100 nm.

As a means to reduce the negative effect on the optical image caused by intrinsic birefringence in fluoride crystal lenses, it is known for example from US 2004/0105170 A1 and WO 02/093209 A2 to arrange fluoride crystal lenses of the same crystallographic cut in rotated orientations relative to each other (a concept known as "clocking") and, in addition, to combine several groups of such arrangements with different crystallographic cuts (for example groups of 100-lenses and groups of 111-lenses) with each other.

Although the negative effect of the intrinsic birefringence can be compensated by this method to a certain extent even in the aforementioned highly refractive cubic materials, a further problem presents itself in that the compensation achieved with the aforementioned "clocking" is incomplete in the case where the respective "compensation paths" are different (i.e., the respective path lengths which the rays that enter into interference with each other traverse in the mutually rotated parts of the same crystallographic cut). This is the case in particular in a projection objective that produces an off-axis image field. Off-axis fields of this kind are present in particular in catadioptric projection objectives with geometric beam-splitting of the type disclosed, e.g., in WO 2004/019128.

The aforementioned problem with different compensation path lengths in different materials used for the compensation of birefringence can also occur in materials with natural birefringence, for example if materials with opposite (positive/negative) signs in their birefringence are combined with each other for compensation, as described in WO 2005/059645, or with the "clocking" of materials with natural birefringence.

SUMMARY OF THE INVENTION

In certain embodiments, an imaging system, in particular a projection objective for a microlithographic projection exposure apparatus, is provided wherein the imaging system allows the use of highly refractive crystal materials even with an off-axis image field, while keeping the negative effect of birefringence on image quality within limits.

According to one aspect, an imaging system, in particular a projection objective of a microlithographic projection exposure apparatus which has an optical axis and produces an image field that is extra-axial relative to the optical axis, includes the following:
  a first optical element which produces a first distribution of the retardation in a plane that extends perpendicular to the optical axis; and
  at least one second optical element which produces a second distribution of the retardation in a plane that extends perpendicular to the optical axis, which second distribution compensates at least partially for the first distribution of the retardation;
  wherein each the first and the second optical element are of a configuration that is not rotationally symmetric to the optical axis.

According to another aspect, an imaging system having an optical axis and being capable of producing an image field which is extra-axial relative to the optical axis is provided. The imaging system includes a first optical element which, during use of the imaging system, causes a first distribution of retardation in a plane that lies perpendicular to the optical axis. The imaging system also includes at least one second optical element which, during use of the imaging system, causes a second distribution of retardation in a plane that lies perpendicular to the optical axis. The second distribution of retardation at least partially compensates the first distribution of retardation, and the first and the second optical elements are not designed with rotational symmetry relative to the optical axis.

According a further aspect, a microlithographic projection exposure apparatus having a projection objective as described above is provided.

According to an additional aspect, a method for the microlithographic production of micro-structured components is provided. The method includes preparing a substrate on which at least one coating of a light-sensitive material is deposited, and preparing a mask which has structures of which images are to be formed. The method also includes preparing a microlithographic projection exposure apparatus as described above, and projecting at least a part of the mask onto an area of the coating by means of the projection exposure apparatus.

According to yet another aspect, a micro-structured component which is produced according to method described above is provided.

The term "retardation" means the difference between the optical path lengths of two orthogonal (i.e., mutually perpendicular) states of linear polarization.

The term "optical axis" as used in the present application means a straight line or a sequence of straight line segments that runs through the centers of curvature of the rotationally symmetric optical components.

The concept of "elements" in the sense of the present application includes the possibility that, e.g., the at least two elements are seamlessly joined to each other, specifically by the technique of wringing, so that they form one lens together.

Due to the fact that in accordance with the invention, the first and the second optical element are not of a rotationally symmetric design relative to the optical axis, i.e., by consciously giving up the principle of rotational symmetry in regard to these elements, it becomes possible to take the extra-axial position of the image field into account and in particular to create the possibility for equal compensation paths in the respective elements with the different distributions of the retardation.

In a preferred embodiment, the first optical element and the second optical element are made of a cubic crystal material, so that their respective retardations are obtained as a result of intrinsic birefringence.

In a further preferred embodiment, the first optical element and the second optical element are made of an optically uniaxial crystal material.

In a preferred embodiment, the retardation caused by the second optical element has the opposite sign of the retardation caused by the first optical element.

In a further embodiment, the first optical element and the second optical element are of the same crystallographic cut and are rotated relative to each other about the optical axis.

In a preferred embodiment, the extra-axial image field is mirror-symmetric relative to a plane of symmetry, and the first and/or the second optical element is mirror-symmetric relative to the same plane of symmetry. Preferably in this embodiment, the first and/or the second optical element have as their only symmetry a mirror-symmetry relative to the plane of symmetry.

In a preferred embodiment, the following condition is met for at least one ray that falls on the center of the image field: $n_1 \times d_1 \approx n_2 \times d_2$, wherein $n_i$ (i=1, 2) stands for the respective refractive indices and $d_i$ (i=1, 2) indicates the geometrical path lengths covered by this ray in the first and the second optical element, respectively. Consequently for this particular ray, it is assured that the optical path lengths in the two partial elements (which at least partially compensate each other in regard to birefringence), in other words the compensation paths for this ray, are equal, so that the reduction of the retardation achieved thereby represents the maximum for the given combination of elements.

If the foregoing condition is met for the largest possible number of rays falling on the center of the image field, one achieves the result that for the rays falling outside of the center of the image field, a possible difference between the compensation paths will at least not be overly large. In other words, according to the invention the optimization of the compensation paths takes place for the rays that fall on the center of the image field, in order to achieve on average as good a compromise as possible in regard to obtaining compensation paths of equal length for the rays that fall outside the center of the image field.

In the ideal case, the condition $n_1 \times d_1 \approx n_2 \times d_2$ stated above is met for all of the rays that fall on the center of the image field, and in any case preferably for rays arriving from the largest possible angular range. In a preferred embodiment, the condition $n_1 \times d_1 \approx n_2 \times d_2$ is met for at least two rays falling on the center of the image field, wherein the angle between the two rays is at least 40°, preferably at least 50°, with even higher preference at least 60°, and with still higher preference at least 70°.

In a preferred embodiment the first element and the second element each have a crystallographic (111)-cut and are arranged with a rotation of 60°+k×120° (wherein k=0, 1, 2, . . . ) relative to each other about the element axis. In this way, by combining the two elements in a principally known manner, one achieves (due to the three-fold symmetry in the distribution of the retardation as a function of the azimuth angle, which applies to the case of the crystallographic 111-cut) an azimuthally symmetric distribution of the retardation as well as a reduction of the maximum values obtained for the retardation.

A preferred embodiment further contains a third and a fourth optical element, each with a crystallographic (100)-cut and arranged with a rotation about the element axis of 45°+l×90° relative to the other (wherein l=1, 2, . . . ). In this way, by combining the third and fourth optical elements, one achieves likewise (due to the four-fold symmetry in the distribution of the retardation as a function of the azimuth angle, which applies to the case of the crystallographic 100-cut) an azimuthally symmetric distribution of the retardation as well as a reduction of the maximum values obtained for the retardation. With preference, the third and fourth optical elements, too, are not configured with rotational symmetry relative to the optical axis. In a preferred embodiment, the condition $n_3 \times d_3 \approx n_4 \times d_4$ is met for at least one ray falling on the center of the image field, wherein $n_i$ (i=3, 4) stands for the respective refractive indices and $d_i$ (i=3, 4) indicates the geometrical path lengths covered by this ray in the third and the fourth optical element, respectively.

In a preferred embodiment at least two, but preferably all, of these optical elements are joined by wringing in such a way that they form a lens together.

With preference, the lens has a rotationally symmetric shape in relation to the optical axis and can in particular be a planar-convex lens.

In a preferred embodiment, the lens is a last refractive lens on the image side of the imaging system.

In a preferred embodiment, each of the optical elements is shaped like a shell whose convex-curved side faces towards the object side.

In a preferred embodiment, a liquid is arranged between at least two of the optical elements, wherein the two elements and the liquid have substantially the same refractive index. In this way, the requirements on the planarity of the contact surfaces between the optical elements can be less stringent, because due to the matching refractive index of the liquid, discontinuities of the refractive index and ray path deflections associated with them can be avoided at least to a far-reaching extent. The liquid needs to be selected appropriately, depending on the refractive index of the optical elements, an example being perhydro fluorene (with n=1.6862 at 193 nm) when the refractive indices of the optical elements are in the range from about 1.6 to 1.7 at a wavelength of 193 nm.

Further preferred embodiments relate to the selection of the cubic crystal material. This selection is made preferably with the aim of a further reduction of the effect of intrinsic birefringence, and expressly allowing for the fact that even when the extra-axial image field is taken into consideration as called for by the invention, a complete compensation of the retardation can lastly not be realized, because the equality of the compensation paths can as a rule not be achieved for all of the rays.

In a preferred embodiment, the cubic crystal material has at a given working wavelength a refractive index n of such a magnitude that the difference (n-NA) between the refractive index n and the numerical aperture NA does not exceed 0.2.

This takes into consideration that the effect of intrinsic birefringence does not increase linearly as the wavelength becomes shorter, but rather begins with a gradual increase and then rises dramatically with a further decrease in the wavelength. This non-linearity is all the more pronounced, the nearer the working wavelength gets to the absorption edge (in the UV range) for the respective material. Thus, according to the preferred embodiment, the possibilities for choosing materials with the highest possible refractive indices are not fully exploited, but the refractive index is selected just as high as required (and not higher) in order to still be able to geometrically guide projection light even under the maximally occurring ray angles through the projection objective so that the rays produce an image. At the same time, according to the invention one takes advantage of the more moderate requirement on the magnitude of the refractive index in order to select a crystal material whose absorption edge lies farther in the UV range, so that as a result the intrinsic birefringence in the range of the working wavelength becomes even smaller, or has increased less strongly, than would be the case in a material whose absorption edge lies at a higher wavelength.

Under the preferred embodiment, for example with a numerical aperture of NA=1.5, one therefore consciously foregoes the option of selecting the crystal materials of the highest possible refractive indices despite the fact that materials are available which are transparent at typical working wavelengths of 193 nm and have high refractive indices of, e.g., n=1.87 (magnesium spinel). Rather, one uses materials in which the refractive index n is farther removed from the (lower) value of the image-side numerical aperture of the imaging system, but is still just sufficient in order to direct the projection light even under the maximally occurring ray angles through the imaging system so that the light rays produce an image.

Preferably, the difference (n-NA) between the refractive index n of the optical element and the numerical aperture NA of the imaging system is in the range from 0.05 to 0.20, with higher preference in the range from 0.05 to 0.15, and with special preference in the range from 0.05 to 0.10. As stated above, due to the upper limit of the refractive index one achieves a limitation of the intrinsic birefringence, while a limit on the overall lens volume of the projection objective is achieved due to the lower limit of the refractive index.

Further criteria that should preferably be met by the materials used in accordance with the invention include adequate stability to withstand atmospheric humidity and UV light, a high degree of hardness, a material that is good to work with in optical manufacturing processes and, as much as possible, a non-toxic composition.

In a preferred embodiment the cubic crystal material includes an oxide for which a sufficient transmissivity was obtained together with a comparatively high refractive index.

In a preferred embodiment the cubic crystal material includes sapphire ($Al_2O_3$) and a potassium- or calcium oxide among its components.

In particular, the cubic crystal material preferably includes at least one material selected from the group that includes $7Al_2O_3.12CaO$, $Al_2O_3.K_2O$, $Al_2O_3.3CaO$, $Al_2O_3.SiO_2KO$, $Al_2O_3.SiO_2.2K$ and $Al_2O_3.3CaO6H_2O$.

The share of sapphire ($Al_2O_3$) in the foregoing materials causes a widening of the band gap or a shift of the absorption edge into the UV range while raising the refractive index at the same time, so that refractive index-lowering further components supplement the mixed crystal, which leads to the aforementioned lowering of the intrinsic birefringence.

In a further preferred embodiment, the cubic crystal material includes calcium, sodium and silicon oxide. In particular, the cubic crystal material preferably contains at least one material from the group that includes $CaNa_2SiO_4$ and $CaNa_4Si_3O_9$.

In a further preferred embodiment, the cubic crystal material contains at least one material from the group that includes $Sr(NO_3)_2$, $MgONa_2O.SiO_2$ and $Ca(NO_3)_2$.

In a further preferred embodiment, a further optical element which is substantially planar-parallel is placed on the light exit surface of the planar-convex lens.

With this type of a component structure for the optical element, one gains the advantage of a particularly effective correction of the spherical aberration which in the case of high aperture values typically represents the largest contribution to the image aberrations that have to be dealt with. If the ray pattern is telecentric in the area of the optical element, the planar-parallel partial element provides in particular an advantageous way to achieve a correction of the spherical aberration that is uniform over the image field.

In contrast to the aforementioned composite structure made up of the first and the second optical element (particularly in the case of the planar-convex lens), if the substantially planar-parallel optical element is composed of mutually rotated portions of the same crystallographic cut, the compensation paths for the portions are substantially equal, so that insofar an effective correction of the intrinsic birefringence can occur by way of the clocking concept. Consequently, it is advantageous to consider arranging in the planar-parallel optical element a second material with a higher refractive index than the material in the first portion. In particular, this higher refractive index can also lie outside the aforementioned interval from the numerical aperture. In a preferred embodiment, the second material is therefore selected from the group consisting of magnesium spinel ($MgAl_2O_4$), yttrium aluminum garnet ($Y_3Al_5O_{12}$), MgO and scandium aluminum garnet ($Sc_3Al_5O_{12}$).

According to a preferred embodiment, the working wavelength is less than 250 nm, preferably less than 200 nm, and with even higher preference less than 160 nm.

According to a preferred embodiment, the imaging system is a catadioptric projection objective with at least two concave mirrors which produces at least two intermediate images.

The invention further relates to a microlithographic projection exposure apparatus, a method of producing microlithographic components, and a micro-structured component.

Further embodiments of the invention are presented in the description as well as in the subordinate claims.

The invention is explained hereinafter in more detail with reference to examples that are illustrated in the attached drawings.

DETAILED DESCRIPTION OF PREFERRED EMBODIMENTS

Figure 1:
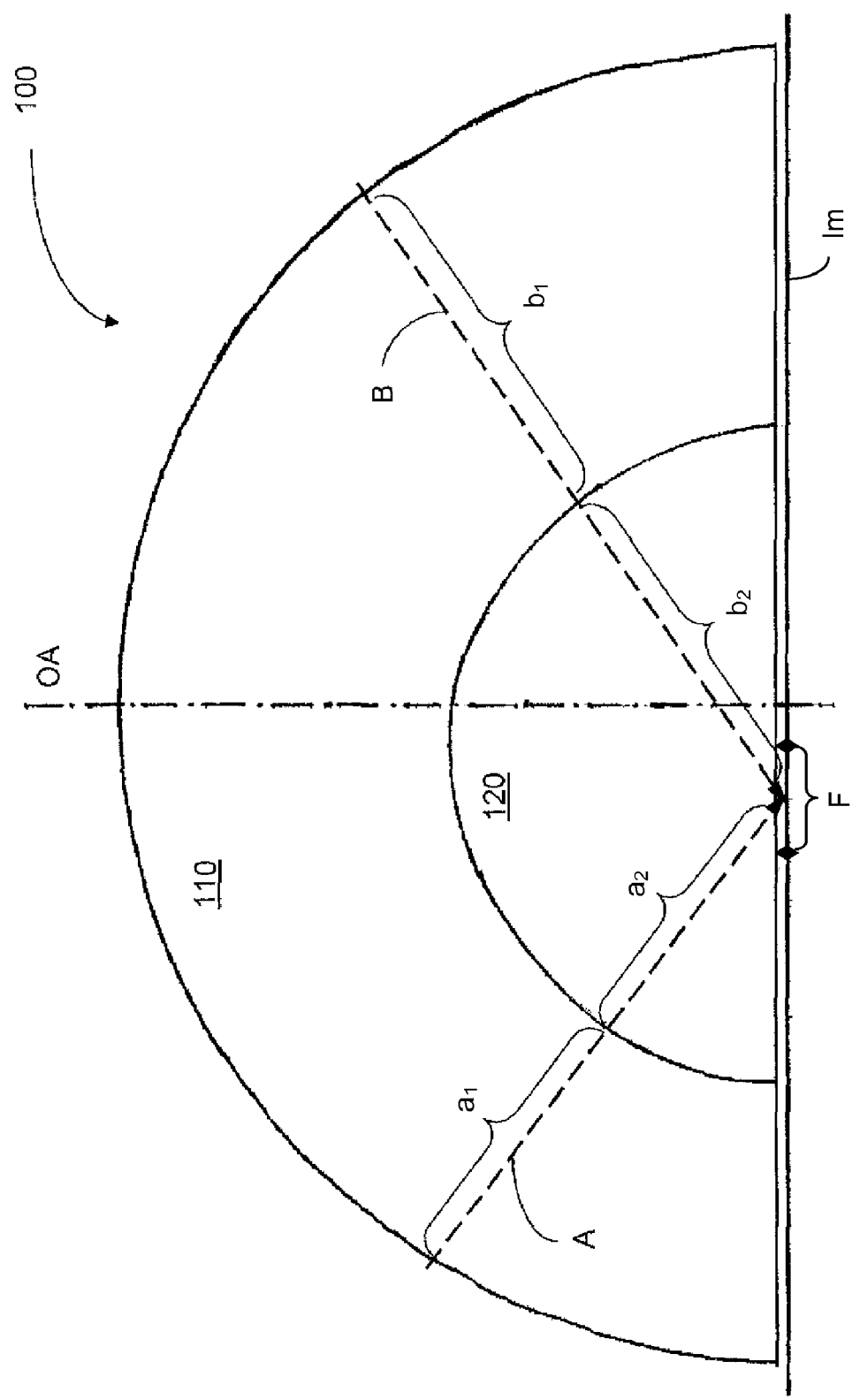
FIGS. 1 to 3 are schematic representations of different preferred embodiments which serve to explain the design structure of an optical element in an imaging system according to the invention.

In a merely schematic manner, FIG. 1 shows the design structure of an optical element 100 in an imaging system according to the invention in accordance with a first preferred embodiment. With preference, the optical element 100 is in particular the last lens on the image side in a microlithographic projection objective whose principal design structure remains to be explained hereinafter in the context of FIG. 4.

Preferably, the imaging system is a catadioptric projection objective in which according to FIG. 1 (in a merely schematic representation that is not true to scale) an off-axis image field "F" (i.e., lying outside of the optical axis "OA") is produced in an image plane "Im". According to FIG. 1, the last optical element on the image side is a planar-convex lens 100 which in regard to its optical outside surface is rotationally symmetric relative to the optical axis OA. However, as shown schematically in FIG. 1, the planar-convex lens is composed of elements 110 and 120 which are not rotationally symmetric themselves relative to the optical axis OA. The first element 110 in FIG. 1 is shaped like a shell in such a way that its concave light-exit surface on the image side is in direct contact with the corresponding light-entry surface of the second element 120.

The elements 110 and 120 in the illustrated example are made of cubic crystal material, preferably of the same material with the same crystallographic cut. According to a first embodiment, both elements can consist of magnesium spinel ($MgAl_2O_4$) with (111)-orientation of the crystallographic cut. However, the elements 110 and 120 are arranged with a rotation of about 60° relative to each other, so that—with equal compensation path lengths in the two elements—one achieves an azimuthally symmetric distribution of the retardation as well as a reduction of the maximum values of the retardation.

The invention is not limited to using cubic crystal materials in the elements 110, 120 (nor in the elements according to the embodiments described hereinafter). For example, the first optical element and the second optical element in a further embodiment can be made of an optically uniaxial crystal material. Suitable materials of the optically uniaxial type are for example lanthanum fluoride ($LaF_3$), sapphire ($Al_2O_3$) or beryllium oxide (BeO), also referred to as bromellite. The materials can also be selected particularly in such a way that the retardation caused by the second optical element has the opposite sign of the retardation caused by the first optical element. For example, the first optical element can be formed of sapphire ($Al_2O_3$) with the refractive indices $n_o=1.7681$ and $n_e=1.7600$ at $\lambda=589.3$ nm, i.e., $\Delta n=n_e-n_o=-0.0081$, and the second optical element can be formed of beryllium oxide (bromellite, BeO) with the refractive indices $n_o=1.7186$ and $n_e=1.7343$ at $\lambda=589.3$ nm, i.e., $\Delta n=n_e-n_o=+0.0157$, so that the birefringence has opposite signs in the two elements, which allows a mutual compensation and a reduction of the maximum values for the retardation to be achieved.

In order to achieve at least to a large extent an agreement between the compensation path lengths, the (asymmetric) arrangement of the two elements 110, 120 according to FIG. 1 is made exactly in such a way that an agreement of the compensation path lengths is achieved for the rays falling on the center of the image field F. Two such rays "A" and "B" are shown as examples, with the distances covered by the rays in the elements 110, 120 identified, respectively, as $a_1$, $a_2$ and $b_1$, $b_2$. To achieve the desired equality of the compensation path lengths, the distances $a_1$, $a_2$ and $b_1$, $b_2$ are selected so that the respective optical path lengths $n_i \times a_i$ (i=1, 2) and $n_i \times b_i$ (i=1, 2) for the two rays A and B turn out the same in the first element 110 and in the second element 120. Since according to this embodiment the refractive indices are the same in the elements 110 and 120, the foregoing condition is reduced to $a_1=a_2$ and $b_1=b_2$.

A further preferred embodiment will be explained with the help of FIG. 2.

Figure 2:
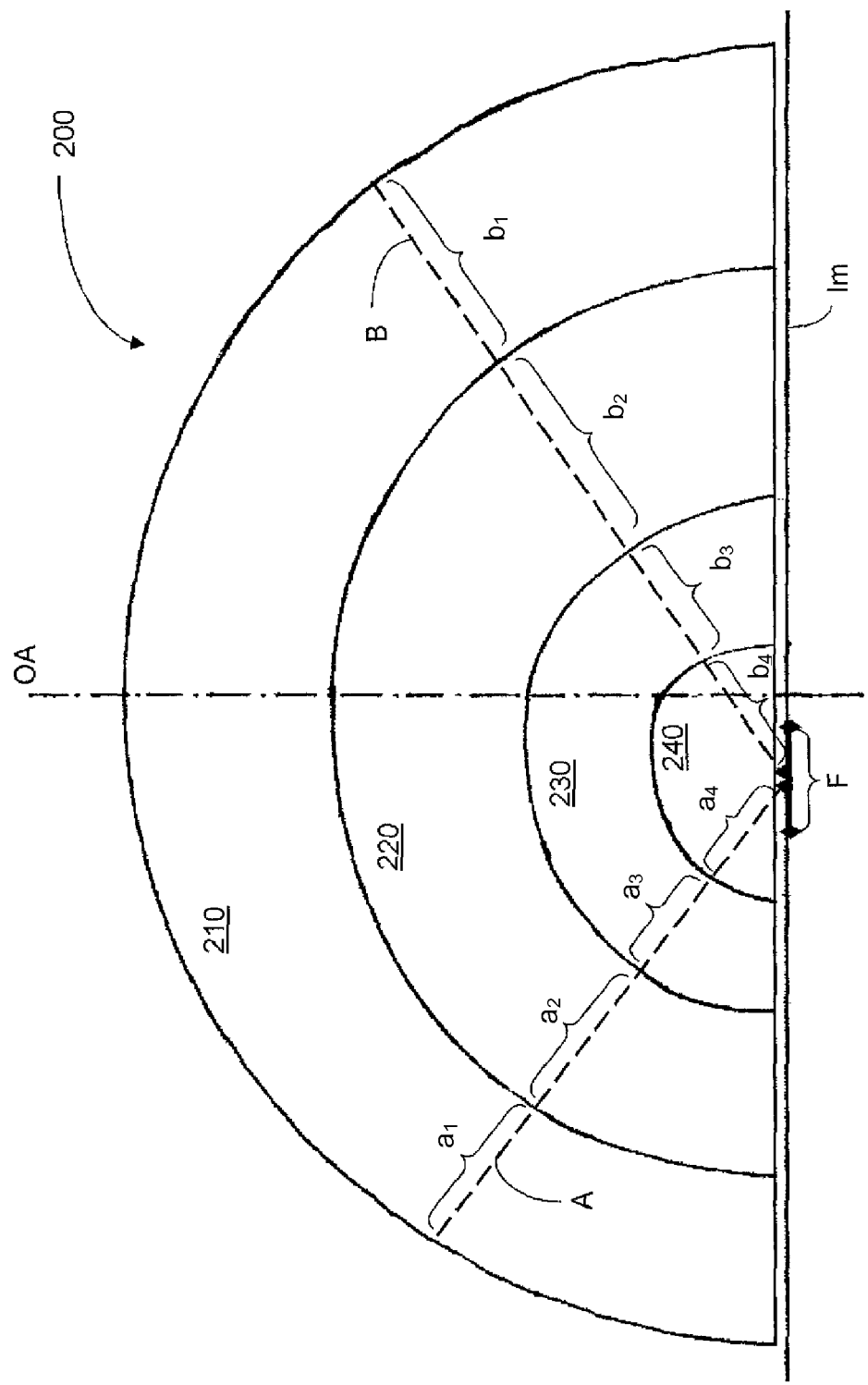

According to FIG. 2, the last optical element on the image side is a planar-convex lens 100 which in regard to its optical outside surface is rotationally symmetric to the optical axis OA but is composed of four elements 210, 220, 230 and 240 which are not rotationally symmetric themselves relative to the optical axis OA. The first element 210, the second element 220 and the third element 230 in FIG. 2 are each shaped like a shell in such a way that a concave light-exit surface is in direct contact with the corresponding light-entry surface of the next following element.

The elements 210 and 220 are analogous to the elements 110 and 220 in regard to crystallographic cut and orientation. In particular, both can consist of magnesium spinel ($MgAl_2O_4$) in (111)-cut orientation arranged with a rotation of about 60° relative to each other. The elements 230 and 240, likewise, can consist for example of magnesium spinel ($MgAl_2O_4$), however in (100)-cut orientation arranged with a rotation of about 45° relative to each other.

Two rays "A" and "B" are again shown as examples. The distances traveled by the rays in the elements 210, 220, 230 and 240 in FIG. 2 are identified, respectively, as $a_1$ to $a_4$ and $b_1$ to $b_4$. To achieve the desired equality of the compensation path lengths, the distances $a_1$ to $a_4$ and $b_1$ to $b_4$ are selected so that the respective optical path lengths $n_i \times a_i$ (i=1, 2) and $n_i \times b_i$ (i=1, 2) for the two rays A and B turn out the same in the element 210 and in the element 220. The optical path lengths $n_i \times a_i$ (i=3, 4) and $n_i \times b_i$ (i=3, 4) in the elements 230 and 240, respectively, are likewise made equal. Since according to this embodiment the refractive indices in the elements are the same, the foregoing conditions are reduced to $a_1=a_2$, $a_3=a_4$, and $b_1=b_2$, $b_3=b_4$, respectively. Preferably, the further condition $a_1/a_3=b_1/b_3\approx 2/3$ is also being met.

The invention is not limited to the arrangement of the optical elements that is shown in FIG. 1 or FIG. 2. Rather, the invention is meant to encompass any arrangement of at least two elements that are not formed in a rotationally symmetric shape relative to the optical axis in an imaging system with an extra-axial image field, wherein each of the two elements is made of a cubic or optically uniaxial crystalline material and the at least two elements are arranged so that the distributions of the retardation that are obtained due to intrinsic or natural birefringence will compensate each other at least partially.

According to further embodiments, the refractive index of the cubic crystal material is of such a magnitude that the difference (n-NA) between the refractive index n and the numerical aperture NA of the imaging system does not exceed 0.2.

If one assumes for example a numerical aperture of NA=1.5 for the projection objective, it is therefore preferred for the refractive index n of the cubic crystalline material of the first partial element to be maximally n=1.7.

A list of materials that are particularly preferred according to the invention is presented in the following Table 1, wherein the refractive index $n_d$ at the wavelength $\lambda=589$ nm for each of the crystal materials is shown in column 2. It should be noted that the refractive index at a typical working wavelength of $\lambda=193$ nm is typically larger by about 0.1.

TABLE 1

| Material | Refractive Index $n_d$ (at $\lambda$ = 589 nm) |
| --- | --- |
| $7Al_2O_3 \cdot 12CaO$ | 1.608 |
| $Al_2O_3 \cdot K_2O$ | 1.603 |
| $Al_2O_3 \cdot 3CaO$ | 1.701 |
| $Al_2O_3 \cdot SiO_2KO$ | 1.540 |
| $Al_2O_3 \cdot SiO_2 \cdot 2K$ | |
| $Al_2O_3 \cdot 3CaO6H_2O$ | 1.604 |
| $CaNa_2SiO_4$ | 1.60 |
| $CaNa_4Si_3O_9$ | 1.571 |
| $Sr(NO_3)_2$ | 1.5667 |
| $MgONa_2O \cdot SiO_2$ | 1.523 |
| $Ca(NO_3)_2$ | 1.595 |

Figure 3:
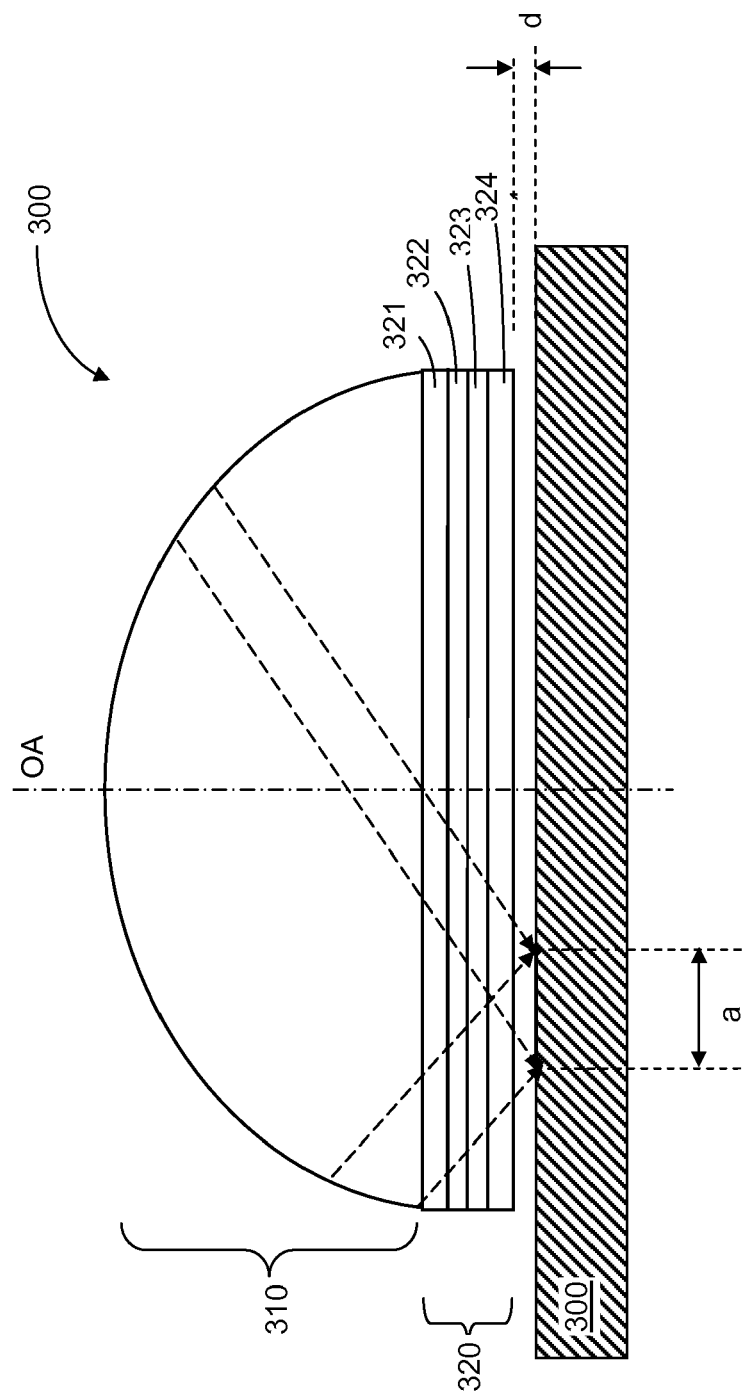

According to a further preferred embodiment of an optical element 300 as illustrated in FIG. 3, a further optical element 320 of substantially planar-parallel shape is placed on the light-exit surface of a planar-convex lens 310 with the configuration described in the context of FIGS. 1 and 2. Preferably, the element 320 is joined by wringing to the light-exit surface of the planar-convex lens 310.

FIG. 3 also schematically shows how the planar-parallel optical element 320 is composed of a total of four parts in the form of planar-parallel plates 321, 322, 323 and 324 which preferably consist of the same cubic crystal material, for example magnesium spinel. The first plate 321 and the second plate 322 are of a crystallographic (111)-cut and are arranged with a rotation of 60° relative to each other (or generally 60°+k×120°, with k=0, 1, 2, . . . ) about the element axis (which in FIG. 3 coincides with the optical axis OA). The third plate 323 and the fourth plate 324 are of a crystallographic (100)-cut and are rotated relative to each other by 45° relative to each other (or generally 45°+l×90°, with l=0, 1, 2, . . . ) about the element axis.

Figure 4:
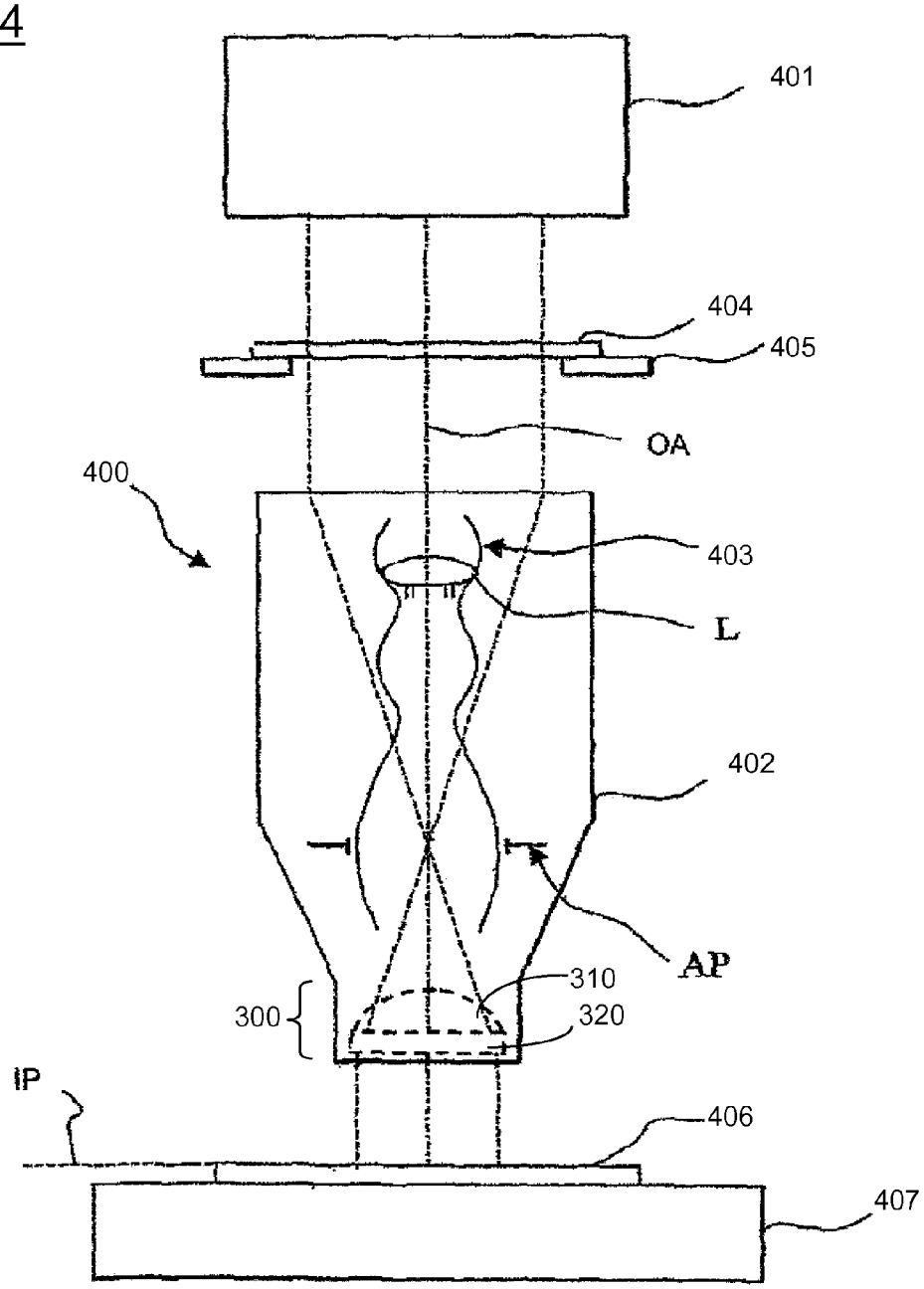
FIG. 4 is a schematic illustration of the principal design structure of a microlithographic projection exposure apparatus which can have a projection objective according to the invention.

FIG. 4 illustrates a projection exposure apparatus 400 with an illumination device 401 and a projection objective 402. The projection objective 402 includes a lens arrangement 403 with an aperture stop AP, wherein an optical axis OA is defined by the schematically indicated lens arrangement 403. Arranged between the illumination device 401 and the projection objective 402 is a mask 404 which is held in the light path by means of a mask holder 405. Masks 404 of this type which are used in microlithography have a structure with details in the micrometer to nanometer range, an image of which is projected by means of the projection objective 402 into the image plane IP, reduced for example by a factor of 4 or 5. A light-sensitive substrate 406, specifically a wafer, which is positioned by a substrate holder 407, is held in the image plane IP. The minimum dimensions of structures that can still be resolved depend on the wavelength λ of the light that is used for the illumination and also on the image-side numerical aperture of the projection objective 402, wherein the ultimately achievable resolution of the projection exposure apparatus 400 increases with shorter wavelengths λ of the illumination device 401 and a larger numerical aperture on the image side of the projection objective 402.

The projection objective 402 is configured as an imaging system in accordance with the present invention. In a merely schematic manner, FIG. 4 indicates in broken lines a possible approximate position of an optical element 300 according to the invention, wherein according to a preferred embodiment the optical element 300 in this example is the last optical element on the image side of the projection objective 402 and therefore arranged in the area of relatively large aperture angles. The optical element 300 can be of a design structure as discussed in the context of FIGS. 1 to 3.

Even though the invention has been described through the presentation of specific embodiments, those skilled in the pertinent art will recognize numerous possibilities for variations and alternative embodiments, for example by combining and/or exchanging features of individual embodiments. Accordingly, it will be understood that such variations and alternative embodiments are considered as being included in the present invention and that the scope of the invention is limited only by the attached patent claims and their equivalents.

The invention claimed is:

1. A system having an optical axis, the system being configured so that during use the system directs radiation along an optical path from an object plane to an image plane, the system comprising:
  a first optical element which comprises a cubic crystal material having a crystallographic (111) cut,
  a second optical element which comprises a cubic crystal material having a crystallographic (111) cut, the second optical element being rotated about the optical axis of the system relative to the first optical element;
  a third optical element which comprises a cubic crystal material having a crystallographic (100) cut and; and
  a fourth optical element which comprises a cubic crystal material having a crystallographic (100) cut, the fourth optical element being rotated about the optical axis of the system relative to the third optical element,
wherein:
  for each set of two adjacent optical elements of the first, second, third and fourth optical elements, a convex surface of one of the optical elements faces a concave surface of the other optical element; and
  the first, second, third and fourth optical elements are between the object plane and the image plane along the optical path.

2. The system according to claim 1, wherein at least two of the optical elements are in the form a lens in which the at least two optical elements are wrung together.

3. The system according to claim 1, wherein the lens is rotationally symmetric relative to the optical axis.

4. The system according to claim 3, wherein the lens is a planar-convex lens.

5. The system according to claim 3, wherein the lens is in last position along the optical path.

6. The system according to claim 1, wherein at least one of the optical elements has the shape of a shell that is convex-curved towards the object plane of the system.

7. The system according to claim 1, further comprising a liquid between two of the optical elements, wherein the liquid has a refractive index that is substantially equal to the refractive index of the two optical elements.

8. The system according to claim 1, wherein the optical elements comprise the same crystal material.

9. The system according to claim 1, wherein the cubic crystal material of at least one of the optical elements is selected from the group consisting of magnesium spinel ($MgAl_2O_4$), yttrium aluminum garnet ($Y_3Al_5O_{12}$), magnesium oxide (MgO), and scandium aluminum garnet ($Sc_3Al_5O_{12}$).

10. The system according to claim 1, wherein the system is configured to operate at a wavelength less than 250 nm.

11. The system according to claim 1, wherein all the optical elements are arranged so that they follow each other in mutually adjacent relationship along the optical axis.

12. The system according to claim 1, wherein at least two of the optical elements have the shape of a shell that is convex-curved towards the object plane of the system.

13. The system according to claim 1, wherein at least three of the optical elements have the shape of a shell that is convex-curved towards the object plane of the system.

14. The system according to claim 1, wherein three of the optical elements have the shape of a shell that is convex-curved towards the object plane of the system.

15. The system according to claim 1, wherein each of the optical elements is convex-curved towards the object plane of the system.

16. An objective, comprising:
  a projection objective comprising the imaging system according to claim 1,
  wherein the projection objective is configured to be used in a microlithographic projection exposure apparatus.

17. An apparatus, comprising:
  an illumination system; and
  a projection objective comprising the imaging system according to claim 1,
  wherein the apparatus is a microlithographic projection exposure apparatus.

18. A method, comprising:
using a microlithographic projection exposure apparatus to make micro-structured components, wherein the microlithographic projection exposure apparatus comprises:
an illumination system; and
a projection objective comprising the imaging system according to claim 1.

19. The method of claim 18, wherein the method comprises:
using the projection objective to project at least a part of an image of a mask onto an area of a light-sensitive coating.

20. A system having an optical axis, the system being configured so that during use the system directs radiation along an optical path from an object plane to an image plane, the system comprising:
a subsystem that consists exactly four optical elements referred to as first, second, third and fourth optical elements, wherein:
the first optical element comprises a cubic crystal material having a crystallographic cut;
the second optical element comprises a cubic crystal material having a crystallographic cut which is the same as the crystallographic cut of the first optical element;
the second optical element is rotated about the optical axis of the system relative to the first optical element;
the third optical element comprises a cubic crystal material having a crystallographic cut;
the fourth optical element which comprises a cubic crystal material having a crystallographic cut which is the same as the crystallographic cut of the third optical element;
the fourth optical element being rotated about the optical axis of the system relative to the third optical element;
for each set of two adjacent optical elements in the subsystem, a convex surface of one of the optical elements faces a concave surface of the other optical element; and
the subsystem is between the object plane and the image plane along the optical path.

* * * * *

UNITED STATES PATENT AND TRADEMARK OFFICE
CERTIFICATE OF CORRECTION

| | | |
|---|---|---|
| PATENT NO. | : 7,446,951 B2 | Page 1 of 1 |
| APPLICATION NO. | : 12/046809 | |
| DATED | : November 4, 2008 | |
| INVENTOR(S) | : Karl-Heinz Schuster | |

It is certified that error appears in the above-identified patent and that said Letters Patent is hereby corrected as shown below:

On the title page item (56), "References Cited", delete "Hoffmann" insert --Hoffman--.

On the title page item (56), Page 2, Column 2, line 4, delete duplicate "WO WO 2005/059617 A2 6/2005".

Column 1, line 11, after "2006" insert --now Pat. No. 7,362,514,--.

Column 5, line 41-42, delete "with in" insert --within--.

Column 10, line 14, after "form" insert --of--.

Signed and Sealed this

Thirtieth Day of December, 2008

JON W. DUDAS
*Director of the United States Patent and Trademark Office*